US008549448B2

(12) United States Patent
Vuillod et al.

(10) Patent No.: US 8,549,448 B2
(45) Date of Patent: Oct. 1, 2013

(54) DELAY OPTIMIZATION DURING CIRCUIT DESIGN AT LAYOUT LEVEL

(75) Inventors: Patrick Vuillod, St. Bernard du Touvet (FR); Jean-Christophe Madre, Grenoble (FR)

(73) Assignee: Synopsys, Inc., Mountain View, CA (US)

( * ) Notice: Subject to any disclaimer, the term of this patent is extended or adjusted under 35 U.S.C. 154(b) by 254 days.

(21) Appl. No.: 12/627,470

(22) Filed: Nov. 30, 2009

(65) Prior Publication Data

US 2011/0010680 A1    Jan. 13, 2011

Related U.S. Application Data

(60) Provisional application No. 61/226,363, filed on Jul. 17, 2009, provisional application No. 61/224,388, filed on Jul. 9, 2009.

(51) Int. Cl.
*G06F 17/50* (2006.01)

(52) U.S. Cl.
USPC ............................ 716/104; 716/113; 716/134

(58) Field of Classification Search
USPC .................................. 716/10, 113, 134, 104
See application file for complete search history.

(56) References Cited

U.S. PATENT DOCUMENTS

| 5,984,510 | A  | * | 11/1999 | Guruswamy et al. | 716/54 |
| 6,487,705 | B1 |   | 11/2002 | Roethig et al.   |        |
| 6,557,159 | B1 | * | 4/2003  | Kutzschebauch et al. | 716/103 |
| 6,584,455 | B1 | * | 6/2003  | Hekmatpour       | 706/45 |
| 6,763,506 | B1 | * | 7/2004  | Betz et al.      | 716/108 |
| 7,278,126 | B2 |   | 10/2007 | Sun et al.       |        |
| 7,484,194 | B2 | * | 1/2009  | Gregory et al.   | 716/113 |
| 7,546,500 | B2 | * | 6/2009  | Kapur et al.     | 714/726 |
| 2005/0120319 | A1 | * | 6/2005 | van Ginneken    | 716/6  |
| 2007/0245281 | A1 | * | 10/2007 | Riepe et al.    | 716/9  |
| 2008/0141193 | A1 | * | 6/2008 | Pikus            | 716/5  |

FOREIGN PATENT DOCUMENTS

| WO | 2004084277 A2 | 9/2004 |
| WO | 2009035772 A1 | 3/2009 |

* cited by examiner

*Primary Examiner* — Vuthe Siek
*Assistant Examiner* — Mohammed Alam
(74) *Attorney, Agent, or Firm* — Kenta Suzue; Haynes Beffel & Wolfeld LLP

(57) ABSTRACT

Aspect of the technology are a method of designing a circuit layout and corresponding computer systems and nontransitory computer media. The circuit layout is for use in forming a lithographic mask set for use in fabricating an integrated circuit. In the method the computer system divides a synthesized circuit design into cell partitions along critical paths of the synthesized circuit design. The computer system associates pins of the plurality of cell partitions with normalized pin timing values. The normalized pin timing values store magnitude differences between a reference timing slack and timing slacks of the plurality of pins. After optimizing the synthesized circuit design, the computer system repeats the method, and then the computer system determines whether to further optimize the plurality of cell partitions by comparing: (i) the pre-optimization normalized pin timing values of the plurality of cell partitions with (ii) the post-optimization normalized pin timing values of the plurality of cell partitions.

20 Claims, 8 Drawing Sheets

DELAY OPTIMIZATION DURING CIRCUIT DESIGN AT LAYOUT LEVEL

REFERENCE TO RELATED APPLICATION

This application claims the benefit of U.S. Provisional Application 61/226,363 filed 17 Jul. 2009, and claims the benefit of U.S. Provisional Application 61/224,388 filed 9 Jul. 2009, all of which are incorporated herein by reference.

BACKGROUND

1. Field of the Invention

The technology relates to Electronic Design Automation (EDA) tools, computer instructions implementing the EDA tools, computers executing the EDA tools, and the circuits designed by the EDA tools.

2. Description of Related Art

Previous attempts to solve the problem of restructuring on a placed netlist have failed for one or more of the following reasons:

Exploring the solutions costs a lot of runtime.

Four engines need to work together (logic structuring, mapping, sizing and placement)

Accepted solutions in their timing context did not carry through to the end of the layout.

Incremental placement on the newly created cells is hard.

Previous solutions fail to get the Quality of Results (QOR) at a small runtime. Previous solutions have to introduce runtime controls that penalize the QOR. The main issue is that the algorithm iterates for a long time and the solutions have poor criteria to determine whether a set of cells should be structured again if the set of cells remain critical after a round of optimization.

Optimization flows from logic equations, to logic gates, to layout, in decreasing levels of abstraction (optimization targets for example the clock frequency of a circuit). As the flow progresses from equations to layout, context is more accurate, but delay optimizations become harder. As the optimization flow progresses, runtime for a unit gain increases, accuracy of estimates increases and gain potential of a change decreases.

Prior techniques of determining whether to halt optimization used arrival and required time information for pins. However, the mere fact that the arrival and required time information differs between two pins, or the same pin under different optimizations, fails to indicate the presence or absence of a need to further optimize the pins.

SUMMARY

Runtime is minimized by minimizing occurrences of redoing the same work on the same structure as the design flow progresses, by using modified timing signatures to determine whether a region needs to be optimized again. Because unneeded work is minimized, logic structuring in a layout environment is scalable. Timing closure is solved more quickly.

Many embodiments are directed to post layout logic restructuring for delay using modified timing signatures, with the logical pass being run in physical context. In embodiments that include optimization with the same computing resources as the other steps, such optimization remaps and replaces the gates on the layout.

One aspect of the technology is a method of designing a circuit layout. The circuit layout is for use in forming a lithographic mask set for use in fabricating an integrated circuit. The method is for use by a computer system having a processor and memory. The method comprises:

the computer system dividing a synthesized circuit design into a plurality of cell partitions along critical paths of the synthesized circuit design;

the computer system associating pins of the plurality of cell partitions with normalized pin timing values, the normalized pin timing values storing magnitude differences between a reference timing slack and timing slacks of the plurality of pins;

after optimizing the synthesized circuit design, the computer system repeating said dividing and said associating, and then the computer system determining whether to further optimize the plurality of cell partitions by comparing: (i) the pre-optimization normalized pin timing values of the plurality of cell partitions with (ii) the post-optimization normalized pin timing values of the plurality of cell partitions.

In some embodiments, the plurality of cell partitions have a persistent topology characteristic through future optimization of the synthesized circuit design. For example the plurality of cell partitions include: (i) fanout free partitions and (ii) fanout partitions. In some embodiments, the plurality of cell partitions include: (i) fanout free partitions of maximum size and (ii) fanout partitions having two levels of depth.

Some embodiments, further include:

responsive to at least one change in one or more of the critical paths, repeating said associating for at least the pins along any critical paths with said at least one change.

In some embodiments, the computer system determines whether to further optimize the plurality of cell partitions, including any of:

(i) requiring structural matching of cell partitions in the plurality of cell partitions, between pre-optimization and post-optimization versions of the cell partitions.

(ii) requiring that the pre-optimization normalized pin timing values and the post-optimization normalized pin timing differ by no more than a predetermined value dependent on a cell library version of the synthesized circuit design.

(iii) requiring that the pre-optimization normalized pin timing values and the post-optimization normalized pin timing differ by no more than a predetermined value dependent on a cell library version of the synthesized circuit design, the predetermined value being a delay fraction of a predetermined gate cell.

In some embodiment the computer system associates pins of the plurality of cell partitions with normalized pin timing values, includes any of:

(i) associating pins on the critical paths with normalized pin timing values.

(ii) associating pins on the critical paths with normalized pin timing values; and associating pins near the critical paths with normalized pin timing values, wherein the pins near the critical paths are within a predetermined delay of the pins on the critical paths, the predetermined delay dependent on a cell library version of the synthesized circuit design.

(iii) associating pins on the critical paths with normalized pin timing values; and associating pins near the critical paths with normalized pin timing values, wherein the pins near the critical paths are within a predetermined delay of the pins on the critical paths, the predetermined delay dependent on a cell library version of the synthesized circuit design, the predetermined delay being a delay fraction of a predetermined gate cell.

(iv) the computer system associating pins of the plurality of cell partitions with the normalized pin timing values according to multiple clocks; and the computer system determining whether to further optimize the plurality of cell partitions includes:

comparing: (i) the pre-optimization normalized pin timing values of the plurality of cell partitions according to multiple clocks with (ii) the post-optimization multiple sets of normalized pin timing values of the plurality of cell partitions according to multiple clocks.

(v) the computer system associating pins of the plurality of cell partitions with the normalized pin timing values according to multiple scenarios; and the computer system determining whether to further optimize the plurality of cell partitions includes:

comparing: (i) the pre-optimization normalized pin timing values of the plurality of cell partitions according to multiple scenarios with (ii) the post-optimization normalized pin timing values of the plurality of cell partitions according to multiple scenarios.

In some embodiments, after said determining, the computer system performs further synthesis of the synthesized circuit design.

In some embodiments, the computer system optimizes the synthesized circuit design. In other embodiments, the computer system relies on other computing resources to perform the optimization.

Another aspect of the technology is a computer system for designing a circuit layout as described herein.

Another aspect of the technology is a nontransitory computer readable medium with instructions for a computer system for designing a circuit layout as described herein.

Another aspect of the technology is a method as described herein where the computer system associating pins of the plurality of cell partitions with normalized pin timing values according to multiple clocks and multiple scenarios, such that the normalized pin timing values storing magnitude differences between a reference timing slack and timing slacks of the plurality of pins.

Another aspect of the technology is a computer system as described herein with logic associating pins of the plurality of cell partitions with normalized pin timing values according to multiple clocks and multiple scenarios, the normalized pin timing values storing magnitude differences between a reference timing slack and timing slacks of the plurality of pins;

Another aspect of the technology is a nontransitory computer readable medium with instructions for a computer system for designing a circuit layout as described herein with instructions associating pins of the plurality of cell partitions with normalized pin timing values according to multiple clocks and multiple scenarios, the normalized pin timing values storing magnitude differences between a reference timing slack and timing slacks of the plurality of pins;

DETAILED DESCRIPTION

Figure 1:
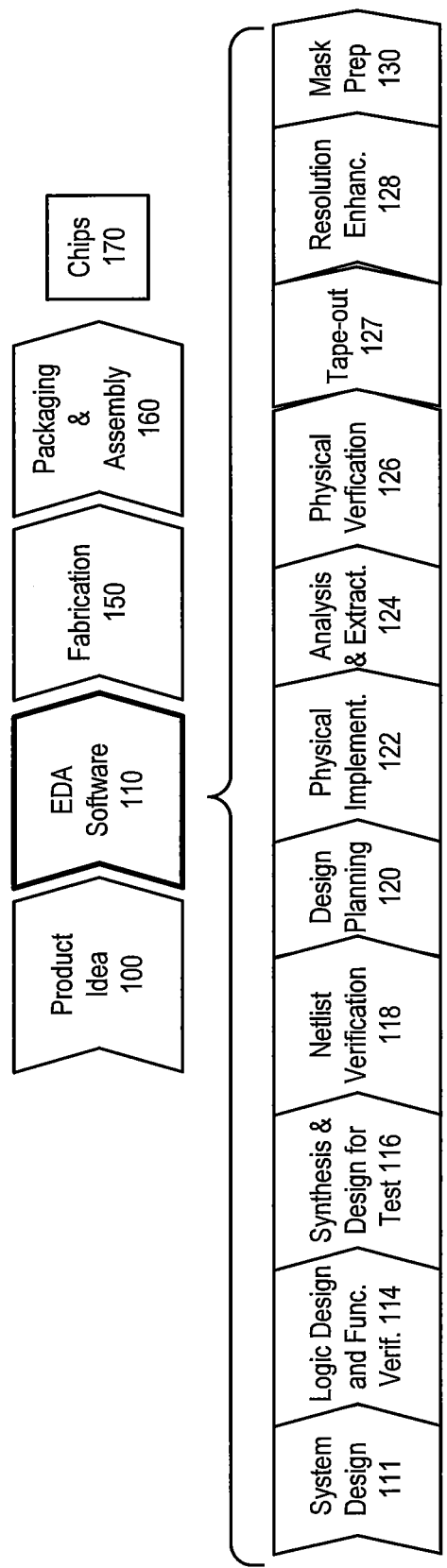
FIG. 1 shows a simplified representation of an illustrative integrated circuit design flow incorporating features of the technology.

FIG. 1 shows a simplified representation of an illustrative integrated circuit design flow incorporating features of the technology. At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape out" data for production of masks for lithographic use to produce finished chips. Example EDA software products from Synopsys, Inc. that can be used at this step include the CATS® family of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS® family of products.

This technology is in Design Compiler Topographical (DC-T) and improves the QOR at a very small runtime cost. DC-T enables a predictable flow resulting in faster time to results by eliminating the costly iteration between synthesis and layout. It accurately predicts post-layout results such as timing, power and area in synthesis while eliminating the need for wire-load model based approximations. It enables users to meet today's design challenges such as fastest timing, smallest area, lowest power consumption and highest test coverage in the shortest design cycle time.

It permits optimizations that no other technique at layout level can do. The example flow below is used in DC-T.

An example algorithm to optimize a cell partition follows:
Decompose the cells into logic primitives such as AND, XOR, MUX.
Optimize on primitives using algebraic and Boolean transforms
Map the primitives to library gates, size, insert buffers
Place the primitives on layout
Change size, insert buffer to fix layout issues
A physically aware RTL to gates flow performs the following steps in an example flow, which can be rearranged or otherwise changed in other embodiments:
High level optimizations (data path, logic structuring, FSM, etc.)
Technology mapping
Gate sizing using a wire load model
Coarse placement
Sizing, buffering on the coarse placed netlist The coarse placement is hidden to the user in one embodiment, but is used to estimate the interconnect delays. In other embodiments, the coarse placement is shown to the user.

DC-T reports timing values that correlate as much as possible with the post placement numbers obtained after physical optimization tools that operate on legalized placed netlists. The performance of DC-T is measured by the Quality of Results (QOR) results of the post placement tools. So the timing number needs to correlate, but also the optimization performed in DC-T needs to carry over (an algorithm is effective if it gives an improvement in DC-T and the improvement can be measured post placement)

When the user improves as much as possible the timing at DC-T level, it will avoid having to do too many iterations with the Layout tools. An algorithm that improves the timing in DC-T and that provides a solution that will eventually yield a better layout is a gain of productivity for users. Accordingly, DC-T is preferable to users over DC-U.

Optimization algorithms such as sizing and buffering improve the timing at the DC-T level but improvements do not carry on to layout because placement aware tools can do sizing and buffering themselves. To have an added value DC-T performs algorithms that work on the structure of the netlist, but driven by the layout constraints.

As the flow progresses, the timing context gets more accurate (close to the final delay estimation). Moreover, coarse placement gives a more accurate estimation of the post layout timing. Improvement or reversion of logic structuring choices that were done in the early steps of the flow, is preferable. These structural changes should have a positive impact on the final layout. A very simple example is to rebalance an N input AND tree so that the delay at the root of the AND tree is minimal.

An embodiment includes the Physical Restructuring engine of DC-T. The approach had a delay gain post DC-T that carried forward to post placement netlists at a small runtime overhead. The approach also has better gains with more runtime.

Figure 2:
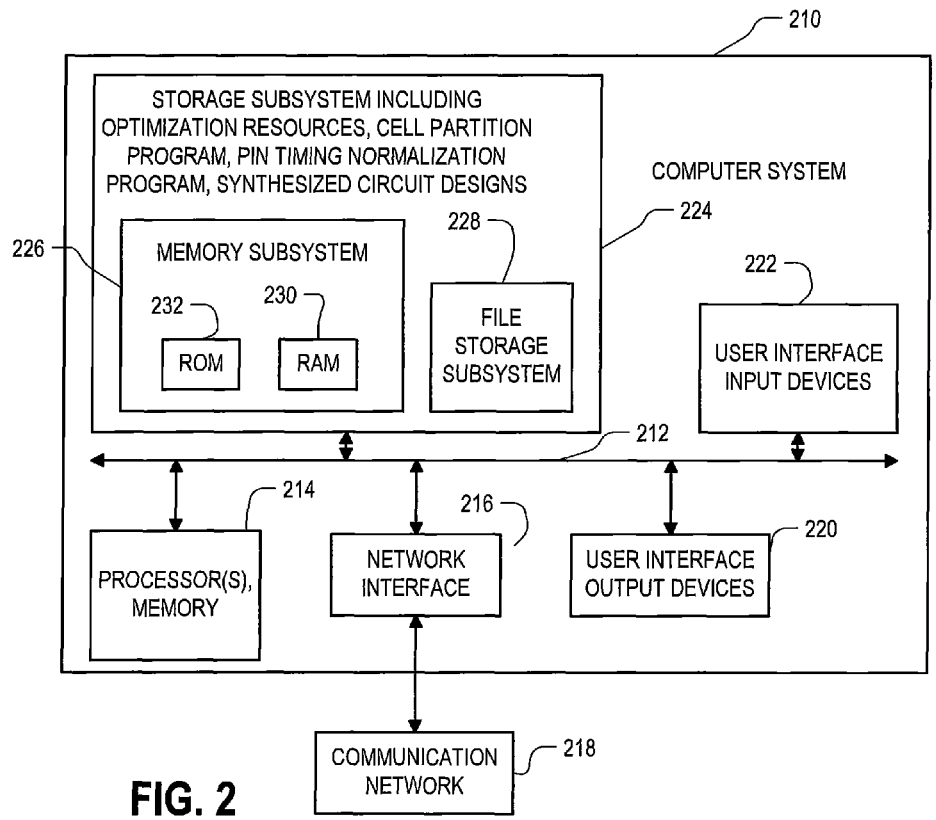
FIG. 2 is a simplified block diagram of a computer system that can be used to implement software incorporating aspects of the technology.
Figure 2A:
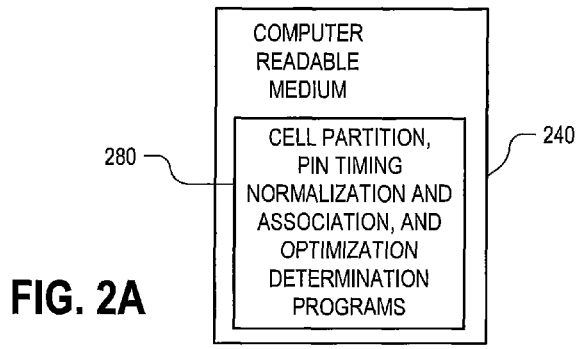

FIG. 2 is a simplified block diagram of a computer system that can be used to implement software incorporating aspects of the technology.

Computer system 210 typically includes a processor subsystem 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of certain aspects of the present invention. For example, the various modules implementing the functionality of a circuit simulator and computer-implemented steps in the present application may be stored in storage subsystem 224. These software modules are generally executed by processor subsystem 214. The data constructs stored in the storage subsystem 224 also can include any technology files, macrocell libraries, layout files, and other databases mentioned herein. Note that in some embodiments, one or more of these can be stored elsewhere but accessibly to the computer system 210, for example via the communication network 218.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD ROM drive, an optical drive, or removable media cartridges. The cell partition, pin timing normalization and association, and optimization determination programs 280 implementing the functionality of certain embodiments of the invention may have been provided on a computer readable medium including transitory media, and nontransitory media 240 such as one or more CD-ROMs (or may have been communicated to the computer system 210 via the communication network 218), and may be stored by file storage subsystem 228. The host memory 226 contains, among other things, computer instructions which, when executed by the processor subsystem 210, cause the computer system to operate or perform functions as described herein. As used herein, processes and software that are said to run in or on "the host" or "the computer", execute on the processor subsystem 214 in response to computer instructions and data in the host memory subsystem 226 including any other local or remote storage for such instructions and data.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever changing nature of computers and networks, the description of computer system 210 depicted in FIG. 2 is intended only as a specific example for purposes of illustrating the preferred embodiments of the present invention. Many other configurations of computer system 210 are possible having more or less components than the computer system depicted in FIG. 2.

Figure 3:
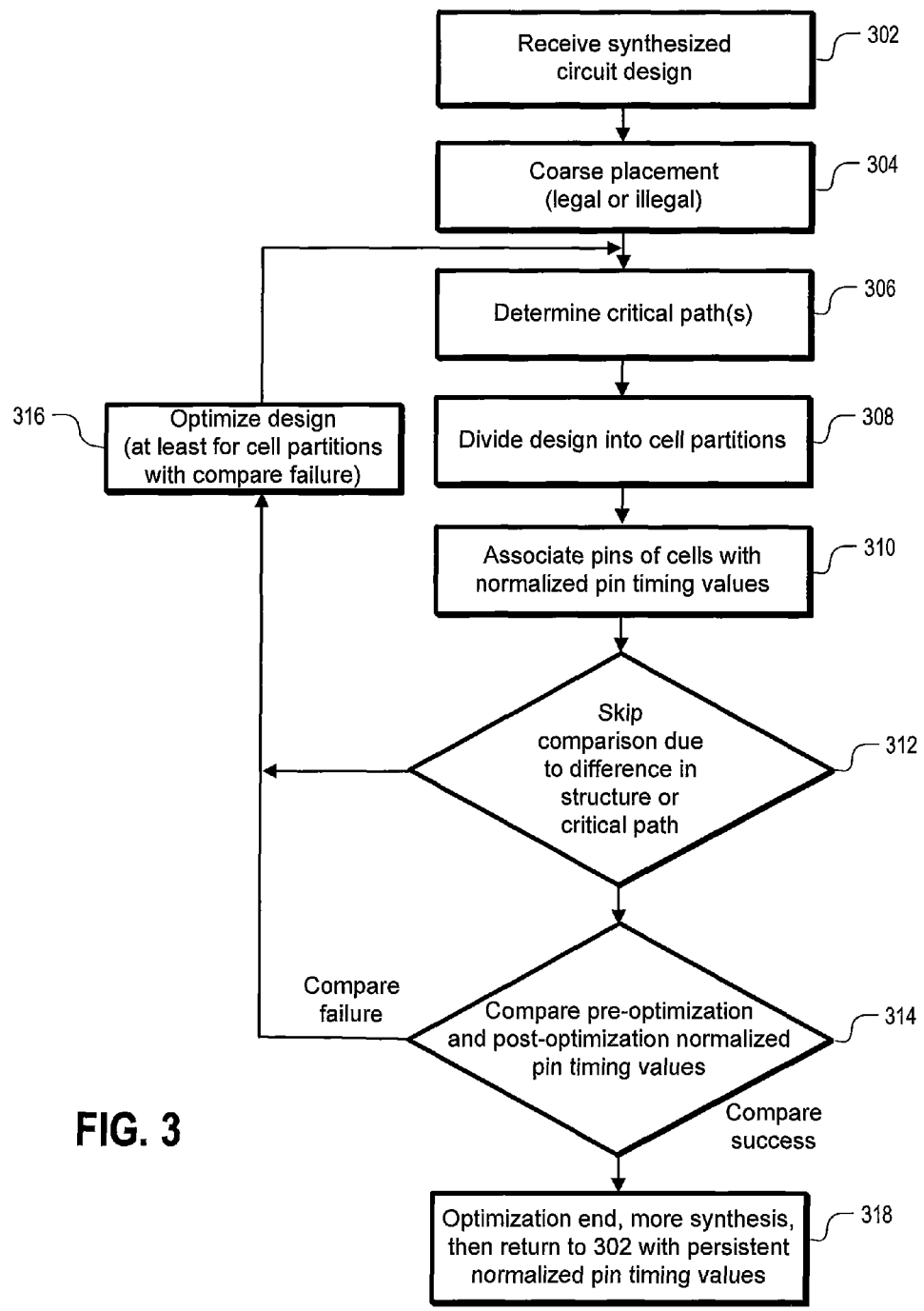
FIG. 3 is a simplified process flow of the technology for determining whether to continue or halt optimization based on comparison of normalized pin timing values.

FIG. 3 is a simplified process flow of the technology for determining whether to continue or halt optimization based on comparison of normalized pin timing values.

In step 302 the synthesized circuit design is received. In step 304 coarse placement is performed. This placement does not need to be 100% legal (some cells may overlap, routing resources may be over-used), and can be performed by different computer processing resources as other steps, or the same computer processing resources.

In step 306 the critical path(s) are determined. Given the placed netlist, collects all the critical cells.

Critical paths are a function of constraints. A constraint is for example a clock period for a given clock. For this constraint, all the sequential elements that are synchronized on that clock are endpoints. A constraint may also be a maximum delay from an input to an output of the design. In that case, outputs will be endpoints.

For each timing constraint, a tag (or slot) is defined. The constraint defines, explicitly or implicitly, start points and endpoints, as well as a maximum delay to go from the start points to the endpoints. Each start point applicable for the constraint is given the arrival time the user defined value for the constraint. Then arrival times are propagated forwards in the circuit. Arrival time of each node is computed given the electrical characteristics of this node (defined in a library). Required times are set at the endpoints given the maximum delay. They are propagated backwards. Slack of each node is the difference between the required times and the arrival times. There's potentially one tag per constraint and per node.

In step 308 the design is divided into cell partitions. For example, the following of the critical cells are created:
One partition contains sets of cells of maximal fanout free trees.
One partition contains sets of cells of tree roots and one level of fanout.

In step 310 pins of cells are associated with normalized pin timing values. The timing spares are computed.

In step 312 a following comparison step is skipped due to differences in structure or critical paths.

Structural matching is a pre-requisite for the following comparison step. Two sets of cells (two "zones") match if the cells are instances of the same library cells and are connected by the same library pins if connections exist between these cells. As a consequence, a set of cells always matches with itself in the structural sense.

If an optimization changes a feature of some critical path, the slacks and spares have to be recalculated. Since the spares are relative (to the most critical pins), they are much more stable. If a change is made to the arrival time of a cell close to the primary inputs, all the arrival times in its fanout will change, but the spares may stay the same, since all the slack will be equally shifted.

Skipping associated with step 312 is followed by further optimization of the design 316. Such further optimization may be performed by different computer processing resources as other steps, or the same computer processing resources.

In step 314 pre-optimization and post-optimization normalized pin timing values are compared.

For structural matching set A and set B, a one-to-one correspondence is made between the pins of set A and set B. For each of the matching pins, the spare is compared. If any spare of two matching pins are different, there's no matching. If one pin has a spare and the other not (one is critical and not the other), there's no matching. If both pins have no spare, there's a match. If may happen that a set of cells does not match with itself in the timing sense when considered at two different steps of the optimization, s0 and sp. Indeed some changes performed in the intermediate steps in the netlist may have left the set of cells unchanged, but may have changed the values of the spares of its pins. This is the strength of the timing signature. If the timing signature at step "sp" matches the timing signature at step "s0", there's no need to redo the optimization at step "sp", because the same result will be obtained as step "s0".

The timing signature can change, without requiring reoptimization, according to a user defined range. For example, a range of 0.01 means that any change of less than 0.01 will be ignored. The higher the range, the better the runtime gain, but at some QOR loss. Timing context includes all the timing related values around the subset of cells: slacks, net capacitances and net transitions.

If there is a compare failure then further optimization of the design 316 follows, at least for cell partitions with a compare failure and cell partitions with a difference in structure or critical path.

Examples of such further optimization are:
Re-structuring of the cell partition.
In sequence, logic factorization, mapping, sizing and rough placement.
Buffer insertion, such as on "fanout" cell partitions.
Incremental placement of the cells of the partition.
Check the timing signature of the set of cells. If it is recorded, skip the partition.
Create a timing zone around the set of cells.
Unmap the gates into 2 input and, xor, and mux primitives.
Compute the timing of the primitives using a timing estimator working on unmapped logic calibrated on the target library. A timing estimator is an engine that estimates the timing through generic logic gates used to describe a logic function. Indeed, a technology library cell like a AND2 has his timing defined in the library provided by the user. A logic function y=a*b does not have any library cell representation, but rather used a generic and gate. The timing estimator computes an estimate of the timing of this generic and gate.
Apply logic structuring moves until the timing in the zone is as good as possible. Logic structuring is the process of transforming a multiple output Boolean function into another logic function that is potentially better for delay or area. Delay is estimated using the timing estimator.
Apply technology mapping. Technology mapping is the process of transforming a multiple output Boolean function into a circuit of library cells.
Do rough placement using locations of the original gates.
Apply sizing on the solution. Sizing is the process of transforming a library cell into another library cell implementing the same Boolean function, but with better timing characteristics.
Discard the solution if the area overhead is too large. Area overhead is too large, according to user definition. Area overhead is too large if the area increase (expressed in % area of the design) per unit delay is higher than the user defined threshold.
Remove the zone and cost the solution with the global cost vector.
Undo the changes if the global cost vector degrades.
Create the timing signature of the set of cells, including margin. The margin is used for spare. There's no margin for net capacitance, but net capacitance is only recorded for nodes that have a spare.

If there is a compare success then optimization "ends" at 318, followed by more synthesis, and then a return to step 302 with persistent normalized pin timing values. The persistent normalized pin timing values are persistent in that a previous run's normalized pin timing values are saved for a future run.

The following are examples of controlling runtime:
The timing zone around the set of cells avoids propagation of timing updates all along the critical path. The timing zone defines a "mini design" around the cells, so the whole circuit isn't updated while running passes. Although the solution does not remove the need of four engines (logic structuring, mapping, sizing and placement) to talk together, they talk more smoothly. The timing values cannot this timing zone while the timing zone is active. The timing zone is active while applying the present technology on the subset of cells.
The timing signature prevents optimizing the same set of cells twice in the same timing context. The optimization will be run again only if the timing context (reflected in the timing signature) changes significantly.
Incremental placement is very simple, due to re-use of the location of the original cells. If there are more cells, the new cells are stacked and the maximal stacking is minimized. Runtime is saved by not requiring a legal placement.
Sets with a large number of cells are not accepted.

The list of operations described above reproduce the complete flow on the set of cells and uses the optimization algorithms of the flow. Other embodiments rearrange or otherwise modify the flow.

Other embodiments rearrange or otherwise modify the flow.

Some embodiments are directed to computation of timing spare to resolve multiple constraints conflicts or talks about timing signature. Some embodiments are directed to the tool, and to physical restructuring existing in another tool with different approaches or runtime controls.

Figure 4:
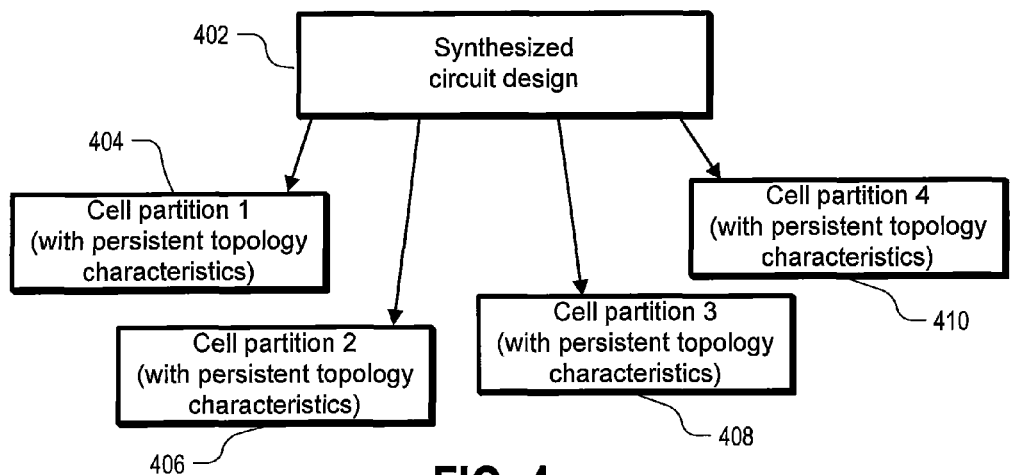
FIG. 4 is an example of partitioning a circuit into cell partitions with persistent topology characteristics.

FIG. 4 is an example of partitioning a circuit into cell partitions with persistent topology characteristics.

The input is a synthesized circuit design 402. The synthesized circuit design 402 may or may not have undergone optimization already. The synthesized circuit design 402 is divided into cell partition 1 404, cell partition 2 406, cell partition 3 408, and cell partition 4 410, all with persistent topology characteristics. A persistent topology characteristic tends to be retained, despite further rounds of optimization. Because of this persistence, processing the further optimized circuit design for a subsequent round of division into cell partitions is likely to result in the same cell partitions as before (absent a structural change etc.)

Figure 5:
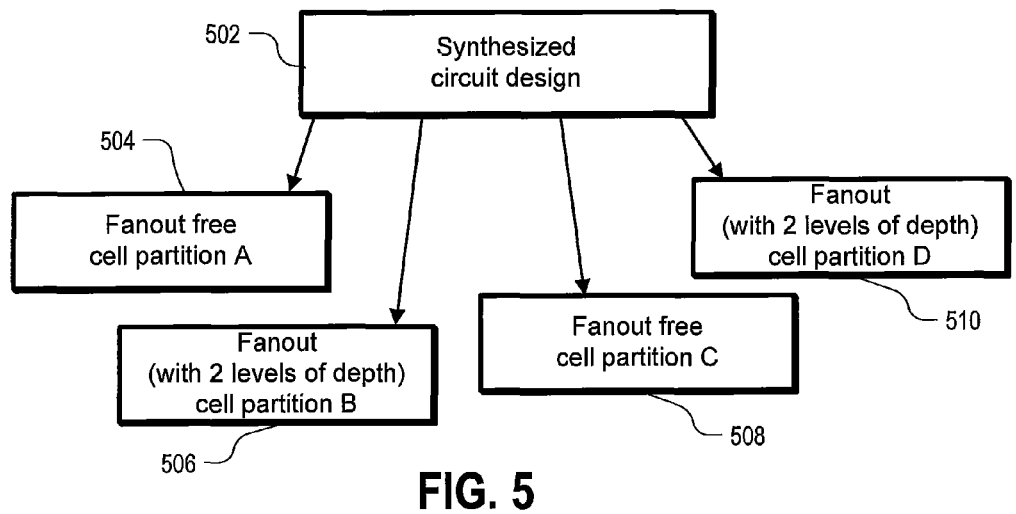
FIG. 5 is another example of partitioning a circuit into cell partitions with persistent topology characteristics.

FIG. 5 is another example of partitioning a circuit into cell partitions with persistent topology characteristics.

The synthesized circuit design 502 may or may not have undergone optimization already. The synthesized circuit design 502 is divided into fanout free cell partition A 504, fanout (with 2 levels of cell depth) cell partition B 506, fanout free cell partition C 508, and fanout (with 2 levels of cell depth) cell partition D 510.

Figure 6:
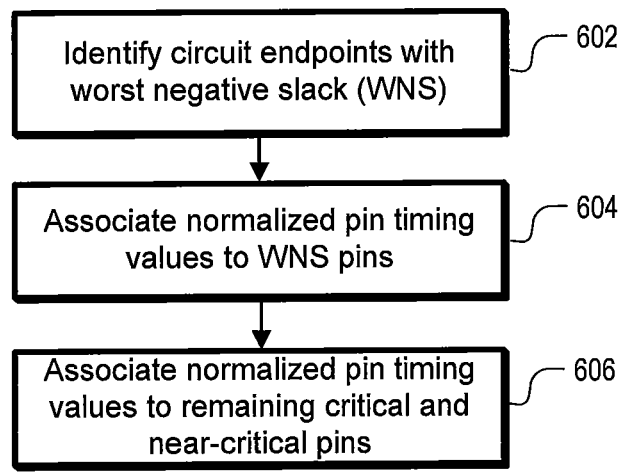
FIG. 6 is an example of associating normalized pin timing values to pins of the critical path and near-critical pins.

FIG. 6 is an example of associating normalized pin timing values to pins of the critical path and near-critical pins.

In 602, the circuit endpoints with worst negative slack (WNS) are identified. In 604, the normalized pin timing values are associated to WNS pins. In 606, the normalized pin timing values are associated to remaining critical and near-critical pins.

Introduction of runtime controls, such as timing signatures, is used in some embodiments. Runtime controls do not degrade the QOR, via timing signatures.

Given a set of cells (the candidate region), a timing signature is a set of integers that characterize the timing context of each critical pin in this set of cells.

Consider two pins g1 and g2, both not critical, but with different arrival and required times. The pins will have the same signature (uninit value). This is better, despite the different arrival and required times, because these two pins will be considered as equal timingwise. This is desirable because they are non critical and their timing does not matter for timing optimization. Such signatures maximize the matching between two signatures. Non-critical points are ignored, although near-critical points are considered. Near-critical pins may become critical as a side effect of changing something on the critical pins. On the other hand, it is optional to store spare at non-near critical pins, due to the added runtime cost and incremental benefit. If two signatures computed at step s0 and step s1 are equal, the set of cells does not need to be optimized again, because the signature guarantees the same timing context and the same logic functions.

Figure 7:
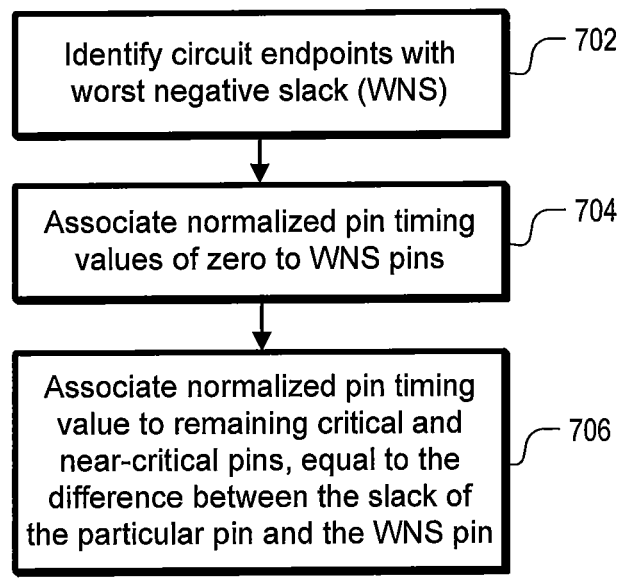
FIG. 7 is another example of associating normalized pin timing values to pins of the critical path and near-critical pins.

FIG. 7 is another example of associating normalized pin timing values to pins of the critical path and near-critical pins.

In 702, the circuit endpoints with worst negative slack (WNS) are identified. In 704, the normalized pin timing values of zero are associated to WNS pins. In 706, the normalized pin timing values are associated to remaining critical and near-critical pins, equal to the difference between the slack of the particular pin and the WNS pin.

When doing delay optimization of a set of cells, two criteria are driving the optimization: the structure and the timing. If the pins that were optimized are tracked, only the structure is considered. By looking at the timing signature, the timing is considered as well.

The "spare" of a non-worst violator endpoint is the difference between the slack of that non-worst violator endpoint, and the slack of the worst violator endpoint. The spare allows comparison of two different pathgroups, despite possible very different absolute arrival rimes or very different absolute required times. The slack of the critical endpoints of two different pathgroups may be different, so spare is a normalization which allows comparison. Whatever the slack, the slack is subtracted from the slack of the critical endpoints rather than taking the absolute value.

A timing signature records, for each pin of each cell:
NIL if pin is not critical
If pin is critical,
  "spare" of this pin. The "spare" is 0 for a pure critical pin, and it's a positive value for a non critical pin that corresponds to the maximum delay degradation at this pin that does not change the cost at the endpoints. "spares" are computed incrementally at each iteration.
  Net capacitance of this pin
  Number of pins of the net of this pin.

All the numbers are originally floating point numbers, in one embodiment. They are transformed into positive integers, with a margin of discretization. The margin is expressed in unit delay. The unit delay is a number derived from the library. It's the typical delay of a nand2 delay. The lower the margin, the fuzzier. The margin allows runtime/QOR trade offs.

Storing the spare at each pin has the property that the spare is independent of the slack at the endpoints. It gives a relative number of the timing value that characterizes the context. This is an interesting property of using the spare. If all the slacks of the candidate region improves with the same magnitude (for instance there was a delay gain in the fanout), the spares stay the same. More description of the spare follows.

The spare is computed by traversing the netlist backwards from the critical endpoints to the startpoints. A maximum range is chosen. For each pathgroup, all the endpoints that are critical within this range are put in a queue. At each endpoint is associated a slack number and a timing tag (or timing slot) that allows following of the most violating paths. For different pathgroups, the slacks may be different, but are equally violating the constraints. In one embodiment, computation of the spare backwards occurs only for pins that are on that particular critical path (following the tag) and that are within the range.

Figure 8:
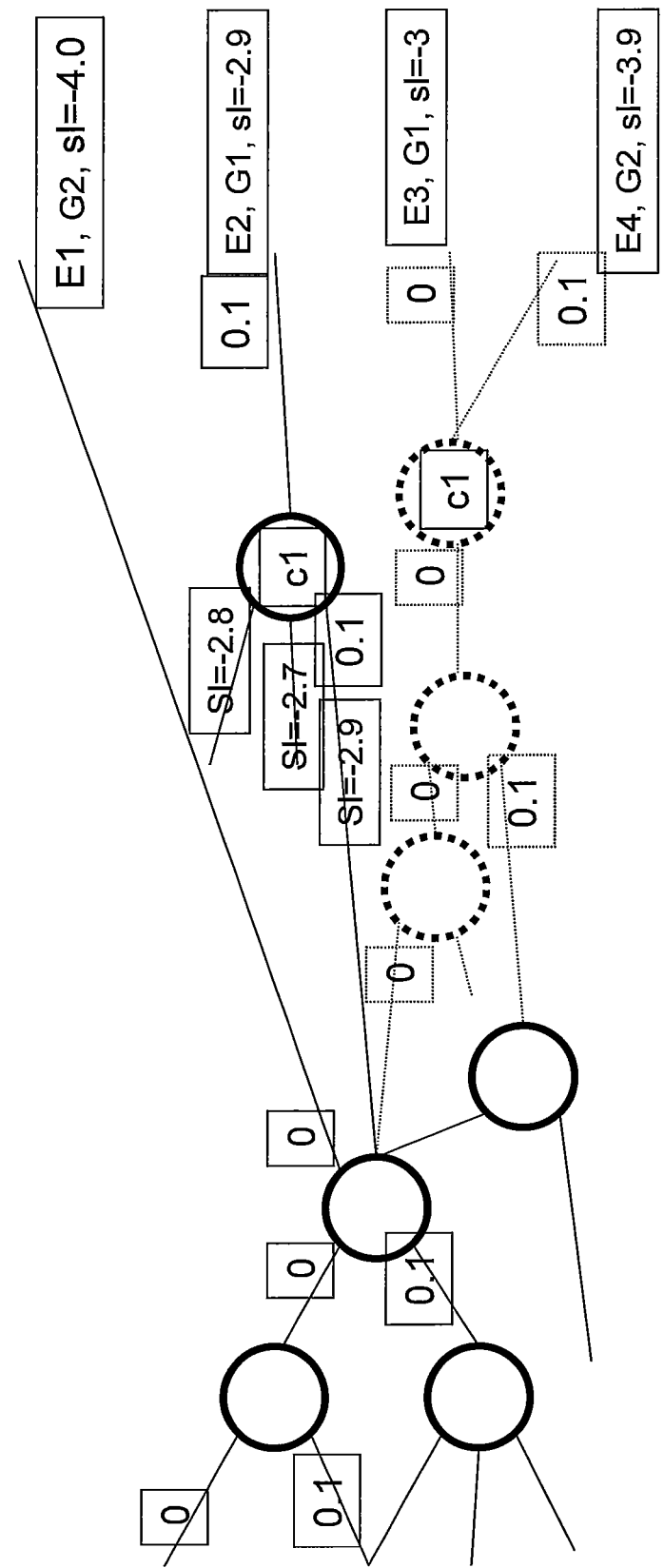
FIG. 8 is a simplified example of computing spares and timing signatures.

FIG. 8 is a simplified example of computing spares and timing signatures.

First we identify the endpoints of the circuit that have the worst violations (worst negative slack, see below) for each pathgroup. A pathgroup corresponds to a user timing constraint (it can be a clock definition with a clock frequency and edges or a false path definition). These endpoints are given a spare value of "0". Any endpoint that is not a worst violator has a spare of X, where X is the difference between slack of the worst violator of the same pathgroup and this endpoint slack. In FIG. 8, we have 4 endpoints E1 to E4, E1 and E4 belong to pathgroup G2 and E2, E3 to pathgroup G1. Slacks are respectively −4, −2.9, −3 and −3.9. E1 and E3 are the worst violators for their pathgroups. They are given a spare of 0. E2 and E4 are not the worst violators and they are given spares of 0.1 because it's the difference between their slack and the worst violator slack. For E4 slack is −3.9 and worst violator slack is the slack of E1, i.e −4. So the difference is −0.1.

Then we propagate the spares backwards in the circuit that is represented as a graph. For all the fanins of a node, the spare of the fanin is the spare of the node plus the difference between the slack of the node and the slack of the fanin. For example, c1 has 3 fanins, the slack value of the fanout is −2.9, and of the fanins respectively −2.8, −2.7, and −2.9. Spare of the fanout is 0.1, hence, spare of the fanins are 0.2, 0.3, and 0.1. We stop the recursion for the first two because we are working on a range of 0.1

The subgraph defined by nodes with spares is called the "critical graph".

Once the spares computed, we identify a zone to be reoptimized. The zone is a connected subset of the critical graph, plus some non critical nodes (not part of the critical graph). The nodes are represented in dashed lines. No non critical node is represented here. The timing signature of the subset of nodes is the set of spare values of these nodes. In addition to spare, we may record some other electrical characteristics like net capacitance and transition to complete the timing signature.

On the timing signature picture, there are two pathgroups G1 and G2, but their worst violators E1 and E3 have different slack. E1 and E3 are to be consider as critical pins, no matter their slack value. By using the spare, and a normalized value for E1 and E3 of 0, they are considered as equal. The same holds for E2 and E4 that are at a spare of 0.1, which represent their distance from the worst violator of their pathgroup.

In one example, a design with two clocks Clk1 and Clk2 has periods 5 and 6. G1 is the group for Clk1 (E2 and E3 are the endpoints). We compute the arrival times at E2 and E3, they would be respectively 8 and 7.9, so their slack would be −3 and −2.9.

Design example with 2 pathgroups G1 and G2.
Worst slack for G1 is −3 and worst slack for G2 is −4.
Spares are propagated on pins (squared box)
Only one spare number even if there are two critical constraints (c1)
Spare=0 spare: critical ones
Spare=0.1 near critical ones
No spare: non critical ones (their spare value does not matter for optimization)
Zone is identified (dashed lines)
Timing signature is the spares of the critical and non critical pins
If a zone with same structure and same timing signature has already been processed, we skip it.

An average 0.48% post placement Worst Negative Slack (WNS) improvement with an average 3% runtime overhead on a set of 110 designs, as achieved. The improvements correlate better than any other algorithms, because the post DC-T improvement is 0.25%. With a 20% runtime budget, 0.86% improvement post placement was achieved. The overhead in runtime was more the sizing passes between the Physical Restructuring passes rather than the Physical Restructuring pass which had a 5% runtime overhead.

Figure 9:
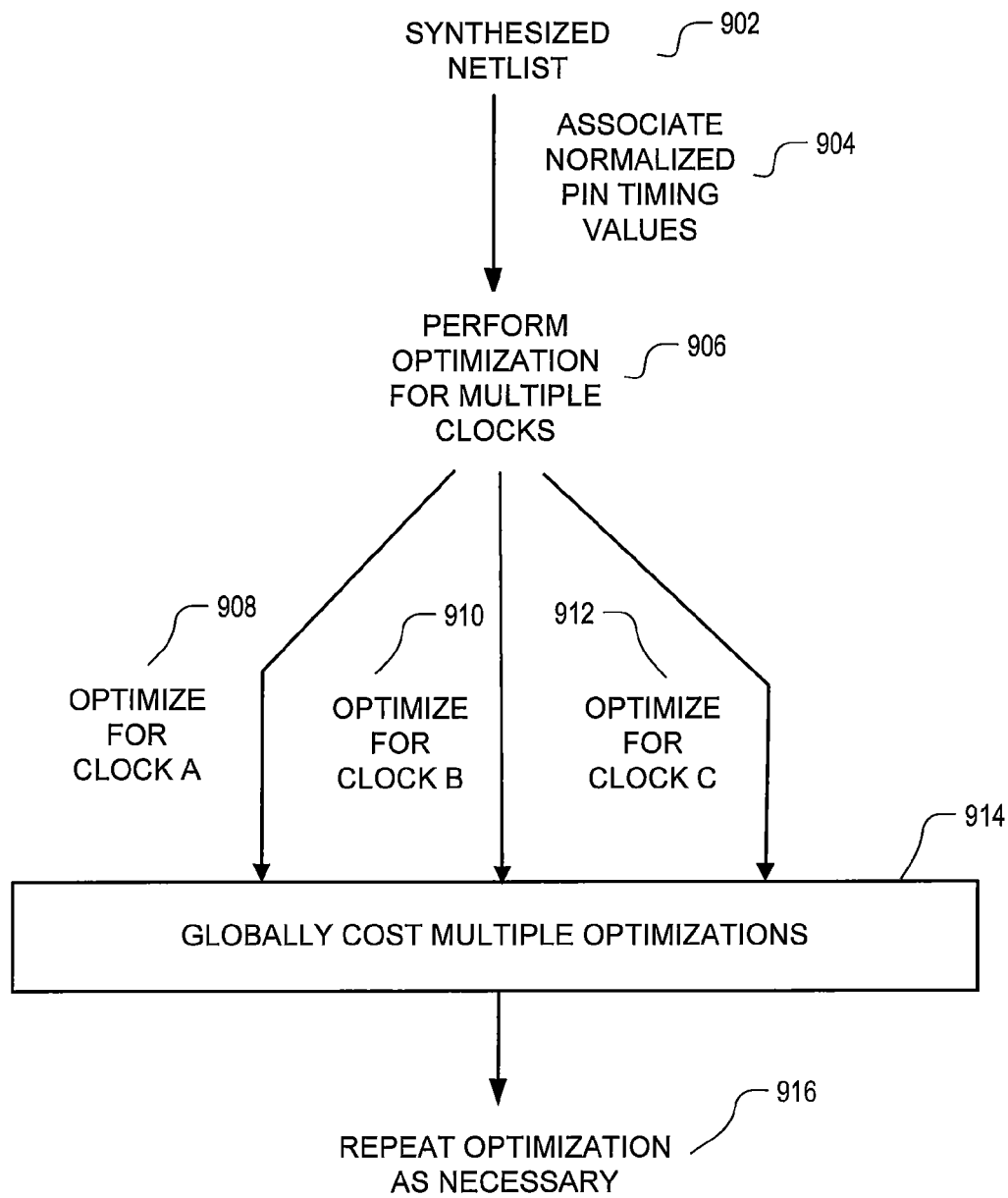
FIG. 9 is a simplified process flow showing multiple parallel processes of the present technology using multiple clocks.

FIG. 9 is a simplified process flow showing multiple parallel processes of the present technology using multiple clocks.

The process begins with a synthesized netlist 902. In 904, normalized pin timing values are associated. In 906, the multiple clock optimization process begins. This example has 3 clocks, although in other examples more clocks are used. In 908, clock A is optimized. In 910, clock B is optimized. In 912, clock C is optimized. In the shown embodiment, the multiple clock optimization process is shown as parallel. In other embodiments, the process is serial, or interleaved.

In 914, the multiple optimizations are globally costed.

Figure 10:
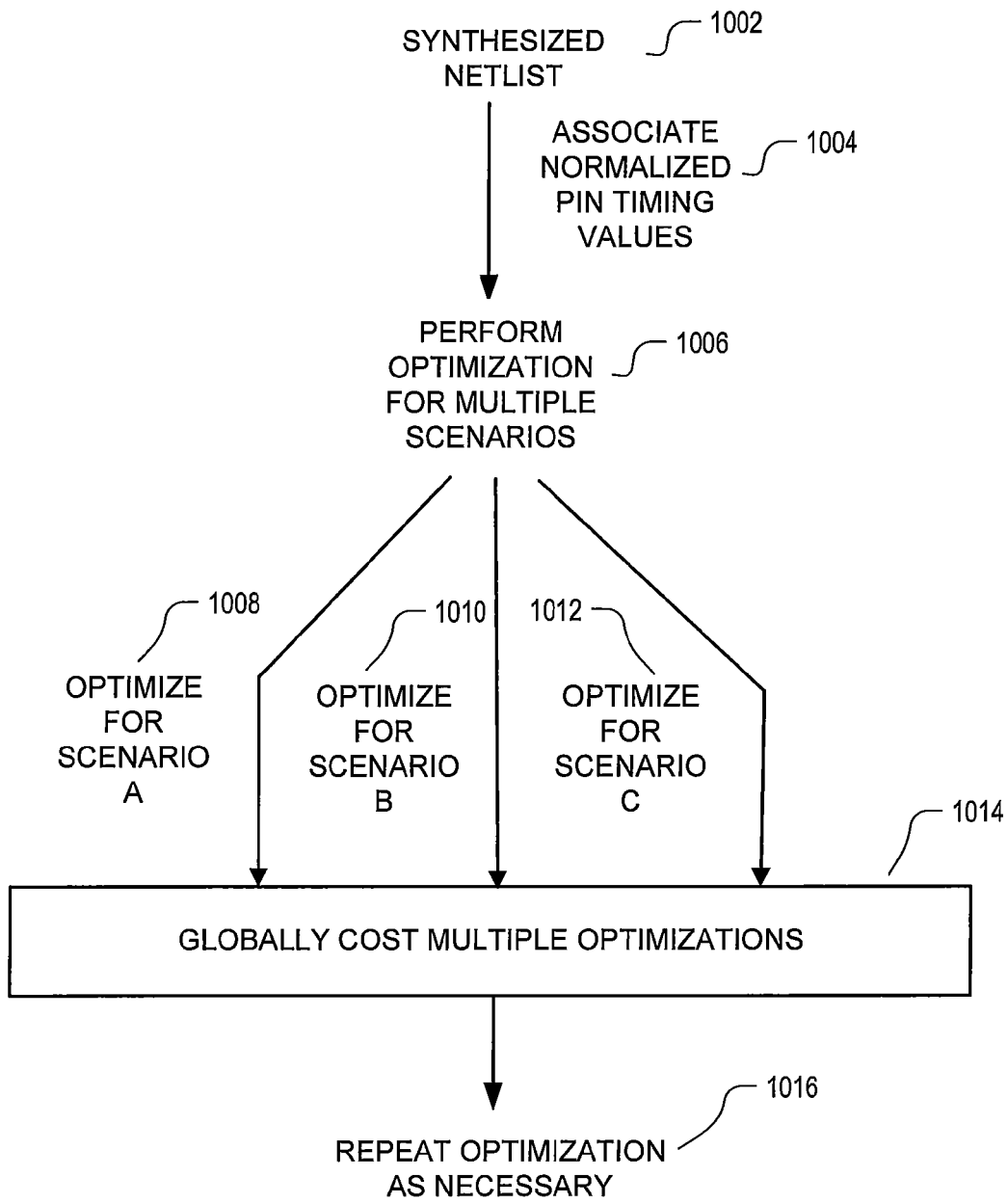
FIG. 10 is a simplified process flow showing multiple parallel processes of the present technology using multiple scenarios.

A global cost vector is the "cost" of the circuit. It's represented as a vector with different values including area, delay and design rules. An optimization algorithm typically works as follows:

Computes the cost
Do a change
Compute the cost
If the cost improves, accepts the change, otherwise rejects the change A "large number" of cells can cause non acceptance of a set, according to the following considerations:

Empirically, not much improvement on a large number of cells.
It takes times too long to optimize
The timing estimate of the logic representation will be potentially less accurate
Placement is not trivial FIG. 10 is a simplified process flow showing multiple parallel processes of the present technology using multiple scenarios.

The process begins with a synthesized netlist 1002. In 1004, normalized pin timing values are associated. In 1006, the multiple scenario optimization process begins. Different scenarios are different voltages, different temperatures, and so on. This example has 3 scenarios, although in other examples more scenarios are used. In 1008, clock A is optimized. In 1010, scenario B is optimized. In 1012, scenario C is optimized. In the shown embodiment, the multiple clock optimization process is shown as parallel. In other embodiments, the process is serial, or interleaved.

In 1014, the multiple optimizations are globally costed.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of designing a circuit layout, the circuit layout for use in forming a lithographic mask set for use in fabricating an integrated circuit, the method for use by a computer system having a processor and memory, the method comprising:

the computer system determining critical paths in a synthesized circuit design of the integrated circuit;
the computer system dividing the synthesized circuit design of the integrated circuit into a plurality of cell partitions along the critical paths of the synthesized circuit design of the integrated circuit;
the computer system associating pins of the plurality of cell partitions along the critical paths of the synthesized circuit design of the integrated circuit with normalized pin timing values, the normalized pin timing values storing magnitude differences between a reference timing slack and timing slacks of the plurality of pins;
after optimizing the synthesized circuit design of the integrated circuit, the computer system re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

2. The method of claim 1, wherein the plurality of cell partitions have a persistent topology characteristic through future optimization of the synthesized circuit design.

3. The method of claim 1, wherein the plurality of cell partitions include:
(i) fanout free partitions and (ii) fanout partitions.

4. The method of claim 1, wherein the plurality of cell partitions include:
(i) fanout free partitions of maximum size and (ii) fanout partitions having two levels of depth.

5. The method of claim 1, further comprising:
responsive to at least one change in one or more of the critical paths, repeating said associating for at least the pins along any critical paths with said at least one change.

6. The method of claim 1, wherein the computer system determining whether to further optimize the plurality of cell partitions, including:
requiring structural matching of cell partitions in the plurality of cell partitions, between pre-optimization and post-optimization versions of the cell partitions.

7. The method of claim 1, wherein the computer system determining whether to further optimize the plurality of cell partitions, including:
requiring that the pre-optimization normalized pin timing values and the post-optimization normalized pin timing differ by no more than a predetermined value dependent on a cell library version of the synthesized circuit design.

8. The method of claim 1, wherein the computer system determining whether to further optimize the plurality of cell partitions, including:
   requiring that the pre-optimization normalized pin timing values and the post-optimization normalized pin timing differ by no more than a predetermined value dependent on a cell library version of the synthesized circuit design, the predetermined value being a delay fraction of a predetermined gate cell.

9. The method of claim 1, wherein the computer system associating pins of the plurality of cell partitions with normalized pin timing values, includes:
   associating pins on the critical paths with normalized pin timing values.

10. The method of claim 1, wherein the computer system associating pins of the plurality of cell partitions with normalized pin timing values, includes:
    associating pins on the critical paths with normalized pin timing values; and
    associating pins near the critical paths with normalized pin timing values, wherein the pins near the critical paths are within a predetermined delay of the pins on the critical paths, the predetermined delay dependent on a cell library version of the synthesized circuit design.

11. The method of claim 1, wherein the computer system associating pins of the plurality of cell partitions with normalized pin timing values, includes:
    associating pins on the critical paths with normalized pin timing values; and
    associating pins near the critical paths with normalized pin timing values, wherein the pins near the critical paths are within a predetermined delay of the pins on the critical paths, the predetermined delay dependent on a cell library version of the synthesized circuit design, the predetermined delay being a delay fraction of a predetermined gate cell.

12. The method of claim 1, wherein
    the computer system associating pins of the plurality of cell partitions with normalized pin timing values, includes:
       the computer system associating pins of the plurality of cell partitions with the normalized pin timing values according to multiple clocks; and
    the computer system determining whether to further optimize the plurality of cell partitions includes:
       comparing: (i) the pre-optimization normalized pin timing values of the plurality of cell partitions according to multiple clocks with (ii) the post-optimization multiple sets of normalized pin timing values of the plurality of cell partitions according to multiple clocks.

13. The method of claim 1, wherein
    the computer system associating pins of the plurality of cell partitions with normalized pin timing values, includes:
       the computer system associating pins of the plurality of cell partitions with the normalized pin timing values according to multiple scenarios; and
    the computer system determining whether to further optimize the plurality of cell partitions includes:
       comparing: (i) the pre-optimization normalized pin timing values of the plurality of cell partitions according to multiple scenarios with (ii) the post-optimization normalized pin timing values of the plurality of cell partitions according to multiple scenarios.

14. The method of claim 1, further comprising:
    after said determining, the computer system performing further synthesis of the synthesized circuit design.

15. The method of claim 1, further comprising:
    the computer system optimizing the synthesized circuit design.

16. A computer system for designing a circuit layout, the circuit layout for use in forming a lithographic mask set for use in fabricating an integrated circuit, the computer system having:
    a processor and memory, comprising:
       logic determining critical paths in a synthesized circuit design of the integrated circuit;
       logic dividing the synthesized circuit design of the integrated circuit into a plurality of cell partitions along the critical paths of the synthesized circuit design of the integrated circuit;
       logic associating pins of the plurality of cell partitions along the critical paths of the synthesized circuit design of the integrated circuit with normalized pin timing values, the normalized pin timing values storing magnitude differences between a reference timing slack and timing slacks of the plurality of pins;
       logic, after optimizing the synthesized circuit design of the integrated circuit, re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

17. A nontransitory computer readable medium with instructions for a computer system for designing a circuit layout, the circuit layout for use in forming a lithographic mask set for use in fabricating an integrated circuit, comprising:
    instructions determining critical paths in a synthesized circuit design of the integrated circuit;
    instructions dividing synthesized circuit design of the integrated circuit into a plurality of cell partitions along the critical paths of the synthesized circuit design of the integrated circuit;
    instructions associating pins of the plurality of cell partitions along the critical paths of the synthesized circuit design of the integrated circuit with normalized pin timing values, the normalized pin timing values storing magnitude differences between a reference timing slack and timing slacks of the plurality of pins;
    instructions, after optimizing the synthesized circuit design of the integrated circuit, re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

18. A method of designing a circuit layout, the circuit layout for use in forming a lithographic mask set for use in fabricating an integrated circuit, the method for use by a computer system having a processor and memory, the method comprising:
    the computer system determining critical paths in a synthesized circuit design of the integrated circuit;
    the computer system dividing the synthesized circuit design of the integrated circuit into a plurality of cell partitions along the critical paths of the synthesized circuit design of the integrated circuit;

the computer system associating pins of the plurality of cell partitions along the critical paths of the synthesized circuit design of the integrated circuit with normalized pin timing values according to multiple clocks and multiple scenarios, the normalized pin timing values storing magnitude differences between a reference timing slack and timing slacks of the plurality of pins;

after optimizing the synthesized circuit design of the integrated circuit, the computer system re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

19. A computer system for designing a circuit layout, the circuit layout for use in forming a lithographic mask set for use in fabricating an integrated circuit, the computer system having:

a processor and memory, comprising:

logic determining critical paths in a synthesized circuit design of the integrated circuit;

logic dividing the synthesized circuit design of the integrated circuit into a plurality of cell partitions along the critical paths of the synthesized circuit design of the integrated circuit;

logic associating pins of the plurality of cell partitions along the critical paths of the synthesized circuit design of the integrated circuit with normalized pin timing values according to multiple clocks and multiple scenarios, the normalized pin timing values storing magnitude differences between a reference timing slack and timing slacks of the plurality of pins;

logic, after optimizing the synthesized circuit design of the integrated circuit, re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

20. A nontransitory computer readable medium with instructions for a computer system for designing a circuit layout, the circuit layout for use in forming a lithographic mask set for use in fabricating an integrated circuit, comprising:

instructions determining critical paths in a synthesized circuit design of the integrated circuit;

instructions dividing synthesized circuit design of the integrated circuit into a plurality of cell partitions along the critical paths of the synthesized circuit design of the integrated circuit;

instructions associating pins of the plurality of cell partitions along the critical paths of the synthesized circuit design of the integrated circuit with normalized pin timing values according to multiple clocks and multiple scenarios, the normalized pin timing values storing magnitude differences between a reference timing slack and timing slacks of the plurality of pins;

instructions, after optimizing the synthesized circuit design of the integrated circuit, re-determining the critical paths in the synthesized circuit design of the integrated circuit, and repeating said dividing and said associating, and then the computer system determining whether to further optimize the plurality of cell partitions by comparing: (i) pre-optimization normalized pin timing values of the plurality of cell partitions with (ii) post-optimization normalized pin timing values of the plurality of cell partitions.

* * * * *